June 29, 1971 R. F. TRAMPOSCH 3,589,936

HETEROEPITAXIAL GROWTH OF GERMANIUM ON SAPPHIRE

Original Filed April 13, 1966

INVENTOR
RALPH F. TRAMPOSCH
BY Robert J Crawford
ATTORNEY

United States Patent Office 3,589,936

Patented June 29, 1971

3,589,936

HETEROEPITAXIAL GROWTH OF GERMANIUM ON SAPPHIRE

Ralph F. Tramposch, Amherst, N.Y., assignor to Air Reduction Company, Incorporated, New York, N.Y.

Continuation of application Ser. No. 542,422, Apr. 13, 1966. This application Aug. 4, 1969, Ser. No. 849,583

Int. Cl. H01l 7/00

U.S. Cl. 117—201 10 Claims

ABSTRACT OF THE DISCLOSURE

Single crystal films of germanium are deposited on sapphire by chemical vapor transport, using a disproportionation reaction involving water vapor and a technique in which the source and substrate are closely spaced. The heteroepitaxial process is sensitive to the substrate orientation, the substrate temperature, and also to the impurity level in the source material. Monocrystalline and highly oriented films of germanium on sapphire have been produced through this process. The films are useful in the preparation of electronic devices.

Figure 1:
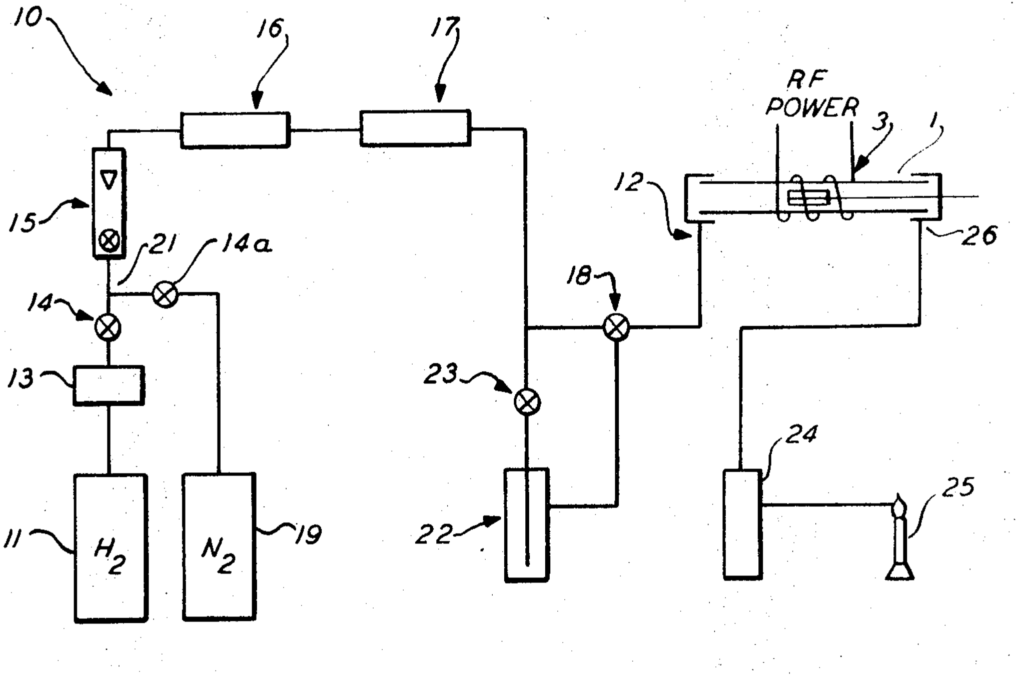

This application is a continuation of application Ser. No. 542,422 filed Apr. 13, 1966, and now abandoned.

This application relates to deposition of highly oriented or single crystal semiconductor material on insulating substrates, and more particularly relates to growth of highly oriented or single crystal germanium semiconductor materials on a sapphire substrate.

Epitaxial growth is defined herein to mean growth of a new crystal material upon a base of the same material to duplicate and extend the crystal system of the base.

Heteroepitaxial growth is defined herein to mean a growth of a first material of one crystal structure upon a base of a different material having a different crystal structure wherein the orientation of the crystal structure of the first material is influenced by, but not a duplication of, the crystal structure of the base material.

In recent years, semiconductor integrated circuits have become one of increasing importance in the micro-electronic industry. One of the primary reasons for the interest in semiconductor integrated circuits is that extremely large numbers of identical circuits can be manufactured simultaneously in a very small amount of material. To date such integrated circuits have been formed within bulk wafers of single crystal silicon or germanium. One of the principal handicaps with this approach has been the inadequacy with which individual elements within the crystal can be electrically isolated from one another. In recognition of this problem, a sizeable technical effort has been put forth by the industry in the past several years in attempts to prepare film of semiconductors, in single crystal form, on insulating substrates. Such a structure would allow the preparation of many separate single crystal "islands" on a common insulating support. So far attempts to accomplish this have failed in terms of film quality, the best films prepared to date having a charge carrier mobility substantially lower than that in bulk single crystal device-quality material. Because of this lack of success, alternative, less direct, techniques to achieve isolation have come under development in the last few years.

As previously noted, present date integrated circuits are formed from bulk wafers of semiconductor material. Such bulk wafers are used because of the relative simplicity of epitaxially growing single crystal semiconductors on single crystal substrates of the same material. For example, single crystal silicon is epitaxially deposited on a base material of single crystal silicon or single crystal germanium is epitaxlially deposited on a base material of single crystal germanium.

Obviously, since the bulk wafer is conductive throughout, isolation can only be obtained through the use of reverse biased p–n junctions which may electrically separate the active regions from the support or substrate. This scheme becomes less attractive in linear, or high frequency circuit applications because of capacitive coupling between the isolating barriers.

One of the many efforts made to deposit single crystal semiconductors on insulating substrates is illustrated in U.S. Pat. 3,139,361 wherein it is disclosed that single crystal silicon has been grown on non-single crystal insulating surfaces by a fluid coating technique wherein the base material is coated with a glassy substance and then a single crystal semiconductor is deposited on the glassy coating.

It has been disclosed in U.S. Pat. 3,152,932 that multicrystal semiconductor materials such as multicrystal germanium may be deposited on a noncrystalline insulating substrate and then additional crystalline material may be epitaxially grown on the previously deposited germanium layer. Such a procedure still falls short of the desired heteroepitaxial growth of a high quality single crystal semiconductor material on an insulating substrate.

Recent reports have disclosed the heteroepitaxial growth of single crystal silicon upon single crystal sapphire. This effort, and insofar as is known, all other efforts, have failed to accomplish the true objective, i.e. to heteroepitaxially grow a single crystal semiconductor on an insulating support from which useful bipolar transistors may be fabricated. To accomplish this objective, it is necessary that the heteroepitaxial layers exhibit electron mobilities which approach the electron mobility of bulk single crystal semiconductor material having the same charge carrier density.

It has been discovered that single crystal germanium layers possessing electron mobilities approaching that found in bulk single crystal germanium can be heteroepitaxially grown on sapphire, i.e. single crystal aluminum oxide. This heteroepitaxial growth is accomplished in a vapor deposition process system by mounting a germanium source in a closely spaced sandwich arrangement with a sapphire substrate, purging the system to create an inert atmosphere, introducing a suitable carrier gas such as pure hydrogen into the system, heating the source to approximately 850° C., heating the substrate to 25°–50° C. less than the source, and exposing the entire assembly to water vapor introduced into said stream of pure hydrogen. This process will be more fully described hereinafter.

It is an object of this invention to provide a heteroepitaxially grown single crystal germanium semiconductor on a sapphire substrate.

It is a further object to define a process for heteroepitaxially growing single crystal germanium on a sapphire substrate.

Figure 2:
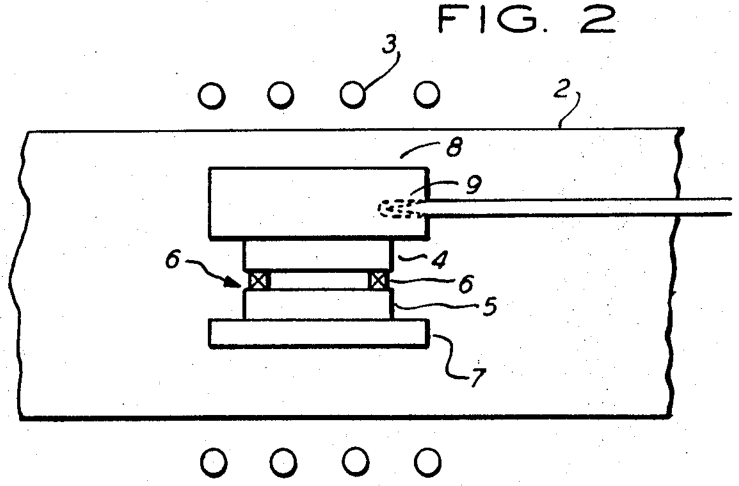

These and other objects will become apparent from consideration of the following detailed description with reference to the drawings, in which:

FIG. 1 is a schematic illustration of the apparatus used for heteroepitaxially growing the single crystal germanium on sapphire; and FIG. 2 is a detail schematic of the reaction chamber of FIG. 1.

FIG. 1 illustrates one chemical vapor deposition apparatus which may be used to grow single crystal germanium on sapphire. The apparatus consists of a gas handling system generally indicated at 10 and a reaction chamber 1. The reaction chamber 1 is shown in detail in FIG. 2 and consists of an elongated glass tube 2 having an induction coil 3 wound thereon. Within the tube a germanium source wafer 4 and a sapphire substrate 5 are separated by quartz spacers 6. The source, substrate, and spacers are sandwiched between two graphite susceptors 7 and 8. The susceptors are inductively heated by the R.F. field of the induction coil 3. A thermocouple 9 is inserted within the side of the susceptor 8 to allow control of the temperature of the source and substrate. By differential coupling of the induction coil 3, the source wafer can be heated to a higher temperature than the substrate 5.

The gas handling system 10 of FIG. 1 comprises a hydrogen source 11 connected to the inlet 12 of tube 1 through a deoxidizer 13, valve 14, flow meter 15, drying column 16, molecular sieve 17, and 3-way valve 18. A nitrogen purge gas source 19 is connected into the system at 21 through valve 14(*a*). A water bubbler 22 is connected into the system by means of stopcock 23 and 3-way valve 18. A mineral oil bubbler 24 and gas burn-off burner 25 are connected to gas outlet 26 of reaction chamber 1.

In heteroepitaxially growing single crystal germanium on sapphire with the system of FIGS. 1 and 2, the system is first purged by the use of nitrogen gas shown at 19. Then hydrogen is introduced into the reaction chamber which is heated to the operational temperature by means of the R.F. coil 3 and susceptors 7 and 8. After temperature stabilization, the hydrogen is admitted to the system and is diverted through distilled water prior to entering the reaction chamber. Germanium is transported from the source wafer to the substrate via the reaction of water vapor in the hydrogen gas with the germanium source in a manner well known in the vapor deposition art.

In one specific example, single crystal germanium was deposited on sapphire using the following procedure:

A single crystal wafer of germanium of (111) crystallographic orientation, heavily doped with arsenic to a concentration of about $10^{19}$ atm./cc. (250 parts per million) was prepared for use as a source by mechanically and chemically polishing to a thickness of 0.025 in. A sapphire disc ⅜ in. diam. and 0.020 in. thick, cut so as to expose the basal, or (0001) crystallographic plane, and polished to surface roughness of less than 1$\mu$ in. (RMS) was used as the substrate. The source wafer and substrate were cleaned and dried prior to use employing standard procedures used widely by those skilled in the art of epitaxial film deposition. The source and substrate were mounted in a configuration as shown in FIG. 2 with a spacing of 0.020 in. The inner diameter of the reaction chamber in this particular example was about ¾ in.

The system was first purged with $N_2$ from source 19. Following the purging operation $H_2$ was admitted into the system, including reaction chamber 1, from source 11, whereupon the source and substrate were heated to approximately 800° C. and 850° C., respectively. After temperature stabilization of the source and substrate, $H_2$ was diverted through stopcock 23, water bubbler 22, and 3-way valve 18 so as to saturate the $H_2$ with distilled water vapor at room temperature. The water vapor saturated $H_2$ flowed at a rate of 60 cc./min. through reaction chamber 1 and mineral oil bubbler 24 and burned off at 25. As the water vapor saturated $H_2$ passes through chamber 1, a disproportionation reaction occurs in which a single crystal layer of germanium is deposited on the sapphire substrate. The reaction which occurs is assumed to be:

$$Ge + H_2O \rightleftharpoons GeO + H_2$$

Single crystal germanium layers epitaxially deposited on sapphire in accordance with the above example have exhibited electron mobilities within a factor of 0.5 to 0.8 of the mobility in bulk single crystal germanium having the same charge carrier density.

The impurity used to dope the source material in the specific example described above is arsenic. While this is the preferred impurity, other impurities may be employed in carrying out the invention. For example, phosphorus in the same or similar concentrations has been utilized to produce heteroepitaxial layers of single crystal germanium on sapphire. The impurity concentration should preferably be in the range of 500–1500 p.p.m.

Although the crystallographic orientation of the source and substrate specified in the above example are preferred, single crystal germanium layers have been deposited on sapphire substrates using different orientations such as for example a source orientation of (110) and a substrate orientation of (0001). In addition, highly oriented germanium layers have been deposited on substrates oriented in the $(11\bar{2}3)$ plane.

To obtain uniform, high quality layers, a spacing or separation of the source and substrate should preferably be 0.015 in. to 0.060 in.

For the ¾ in. inner diameter reaction chamber of the above specific example, the flow rate of the water vapor saturated $H_2$ is preferably less than 100 cc./min. Should the rate be too high, the deposited layers exhibit discontinuities. It is also desirable that the rate exceed 50 cc./min. in the ¾ in. inner diameter to prevent possible depletion of water vapor in the reaction chamber.

For best results, it has been found that the source material temperature should be at least 800° C. but not exceed 875° C., and the substrate material should be at least 775° C. but not exceed 850° C. The temperature difference in the source and substrate should be at all times at least 25° C. and less than 50° C.

The preferred embodiment of the invention has been illustrated and described, but changes and modifications can be made, and some features can be used in different combinations and processes without departing from the invention defined in the following claims.

I claim:

1. An article of manufacture comprising a sapphire substrate and a single crystal semiconductor layer of germanium on said substrate.

2. An article of manufacture as in claim 1 wherein said germanium layer contains arsenic or phosphorus in semiconductor impurity concentrations.

3. An article of manufacture as in claim 2 wherein said germanium layer is located on the $(11\bar{2}3)$ crystalgraphic plane of said sapphire substrate.

4. An article of manufacture as in claim 2 wherein said germanium layer is located on the (1123) crystallographic plane.

5. A process for heteroepitaxially depositing a single crystal layer of germanium on a sapphire substrate comprising the steps of mounting within a reaction chamber a germanium source in a closely spaced sandwich arrangement with a sapphire substrate, introducing a suitable carrier gas into said reaction chamber, heating the germanium source to a temperature of at least 800° C. but less than 875° C., heating the substrate to 25° C. to 50° C. less than the source, and introducing water vapor into said carrier gas stream to create a water vapor saturated carrier gas stream wherein said layer of germanium is heteroepitaxially deposited on said sapphire substrate.

6. A process as in claim 5 wherein said germanium source is doped with an impurity selected from the group of arsenic and phosphorus and wherein the concentration of said impurity in the germanium source is 500 to 1500 parts per million.

7. A process as in claim 6 characterized by said carrier gas being pure hydrogen.

8. A process for heteroepitaxially depositing a layer of germanium on a sapphire substrate comprising the steps of mounting within a reaction chamber a germanium source in closely spaced sandwich arrangement with a sapphire substrate, introducing a suitable carrier gas into said reaction chamber, heating the germanium source to a temperature of at least 800° C. but less than 875° C., heating the substrate to 25° C. to 50° C. less than the source, and introducing water vapor into said carrier gas stream to create a water vapor saturated carrier gas stream wherein said layer of germanium is hetero-epitaxially deposited on said sapphire substrate, said germanium source being doped with an impurity selected from the group consisting of arsenic and phosphorus with the concentration of said impurity in the germanium source being 500 to 1500 parts per million, said carrier gas being pure hydrogen and said germanium source and said sapphire substrate being spaced apart at least 0.015 inch but less than 0.060 inch.

9. The process of claim 8 characterized by the reaction chamber having an inner diameter of approximately ¾ inch.

10. The process of claim 9 characterized by the flow rate of the water vapor saturated carrier gas through the reaction chamber being at least 50 cc./min. but less than 100 cc./min.

References Cited

UNITED STATES PATENTS

| | | | |
|---|---|---|---|
| 3,312,572 | 4/1967 | Norton et al. | 117—201 |
| 3,375,145 | 3/1968 | Setchfield et al. | 148—175 |

OTHER REFERENCES

IBM Tech. Disclosure Bulletin "Boss et al.," vol. 5, No. 12, May 1963.

J. App. Phy. "Manaseuit et al.," April–June 1964, pp. 1349–1351.

WILLIAM L. JARVIS, Primary Examiner

U.S. Cl. X.R.

117—106; 148—1.6

UNITED STATES PATENT OFFICE

CERTIFICATE OF CORRECTION

Patent No. 3,589,936 Dated June 29, 1971

Inventor(s) Ralph F. Tramposch

It is certified that error appears in the above-identified patent and that said Letters Patent are hereby corrected as shown below:

Column 1, line 43, "one" should be deleted;
line 55, "film" should read -- films --.
Column 2, line 1, "epitaxlially" should read -- epitaxially --.
Column 3, line 5, "R.F." should read -- r.f. --;
line 26, "R.F." should read -- r.f. --;
line 42, "(RMS)" should read -- (rms) --;
line 53, "source and substrate" should read -- substrate and source --.
Column 4, line 42, "$(11\bar{2}3)$" should read -- $(0001)$ --;
line 45, "$(1123)$" should read -- $(11\bar{2}3)$ --;
line 51, "a" should be deleted.

Signed and sealed this 21st day of November 1972.

(SEAL)
Attest:

EDWARD M.FLETCHER,JR.
Attesting Officer

ROBERT GOTTSCHALK
Commissioner of Patents